United States Patent
Hwang

(10) Patent No.: US 11,231,783 B2
(45) Date of Patent: Jan. 25, 2022

(54) APPARATUS FOR GENERATING VIBROTACTILE SENSATION

(71) Applicant: Electronics and Telecommunications Research Institute, Daejeon (KR)

(72) Inventor: Inwook Hwang, Sejong-si (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 16/990,520

(22) Filed: Aug. 11, 2020

(65) Prior Publication Data
US 2021/0048887 A1   Feb. 18, 2021

(30) Foreign Application Priority Data

Aug. 12, 2019  (KR) .................. 10-2019-0098361
Jul. 30, 2020  (KR) .................. 10-2020-0095163

(51) Int. Cl.
*G06F 3/041* (2006.01)
*G06F 3/01* (2006.01)
*H03K 17/96* (2006.01)

(52) U.S. Cl.
CPC ......... *G06F 3/016* (2013.01); *H03K 17/9627* (2013.01); *H03K 2017/9602* (2013.01)

(58) Field of Classification Search
CPC ............... G06F 3/016; H03K 17/9627; H03K 2017/9602; H03K 2217/96062
See application file for complete search history.

(56) References Cited

U.S. PATENT DOCUMENTS 8,873,121 B2*  10/2014  Shin ................. G02B 26/103
                                              359/199.4
10,058,712 B2   8/2018  Chung et al.
2012/0306790 A1  12/2012  Kyung et al.
(Continued)

FOREIGN PATENT DOCUMENTS

KR         101340358 B1   12/2013
KR      1020150004276 A    1/2015
(Continued)

OTHER PUBLICATIONS

Hojin Lee et al., Mid-Air Tactile Stimulation Using Indirect Laser Radiation, IEEE Transactions on Haptics, Oct.-Dec. 2016, pp. 574-585, vol. 9, No. 4, IEEE.
(Continued)

*Primary Examiner* — Insa Sadio
(74) *Attorney, Agent, or Firm* — William Park & Associates Ltd.

(57) ABSTRACT

Provided is an apparatus for generating a vibrotactile sensation. The apparatus for generating a vibrotactile sensation includes a light source generating light, a vibration layer generating a vibration by receiving the light, a vibration detection unit disposed adjacent to the vibration layer to detect a vibration signal of the vibration layer, and a control unit connected to the vibration detection unit to determine the vibration of the vibration layer by using the vibration signal. Here, the vibration layer includes a thermo-elastic layer that has a first thermal expansion coefficient and a photo-thermal conversion layer that is disposed on the thermo-elastic layer and has a second thermal expansion coefficient less than the first thermal expansion coefficient.

11 Claims, 3 Drawing Sheets

(56) References Cited

U.S. PATENT DOCUMENTS

2014/0285328 A1* 9/2014 Chung .................. G08B 6/00
340/407.1
2018/0143690 A1 5/2018 Hwang

FOREIGN PATENT DOCUMENTS

KR 101581763 B1 2/2016
KR 101825674 B1 2/2018

OTHER PUBLICATIONS

Hojun Cha et al., Mid-air Tactile Display Using Indirect Laser Radiation for Contour-Following Stimulation and Assessment of Its Spatial Acuity, 2017 IEEE World Haptics Conference(WHC), Jun. 6-9, 2017, pp. 136-141, Fürstenfeldbruck (Munich), Germany.
Jae-Hoon Jun et al., Laser-induced thermoelastic effects can evoke tactile sensations, Scientific Reports, 5:11016, Jun. 5, 2015, pp. 1-16.
Seung-Eun Kim, Study on the Dependence of Indirect Laser Tactile Stimulation on Medium Properties, Feb. 25, 2019, pp. 1-65, Department of Photonic Engineering Graduate School of Chosun University.

* cited by examiner

APPARATUS FOR GENERATING VIBROTACTILE SENSATION

CROSS-REFERENCE TO RELATED APPLICATIONS

This U.S. non-provisional patent application claims priority under 35 U.S.C. § 119 of Korean Patent Application Nos. 10-2019-0098361, filed on Aug. 12, 2019, and 10-2020-0095163, filed on Jul. 30, 2020, the entire contents of which are hereby incorporated by reference.

BACKGROUND

The present disclosure herein relates to a contactless driving apparatus, and more particularly, to an apparatus for generating a vibrotactile sensation.

A tactile sensation feedback technology is largely divided into a force feedback that transmits position information and a force to a muscle and a joint and a vibrotactile feedback that transmits a vibration and a fine texture of an object to a skin. For the tactile sensation feedback, a mechanical stimulus such as a force, a movement, or a vibration generated from an actuator should be transmitted to a body of a user. A contactless tactile sensation display, which has researched in recent years, transmits a stimulus generated from an actuator to the body through the air instead of using mechanical connection or direct contact to the body of the user. Thus, the contactless tactile sensation display may have an advantage in that a movement of the user is not restricted because an actuator, a power, a control unit, and a connection structure for supporting and transmitting a power are not necessarily attached to the body. On the other hand, the contactless tactile sensation display may have a disadvantage in that a strong tactile sensation is hardly generated due to absence of a direction contact between the skin and the actuator, and a tactile sensation generation efficiency is low in consideration of a power consumed by a loss caused by dispersion and attenuation in a process of transmitting energy generated from the actuator to the air.

SUMMARY

The present disclosure provides an apparatus for generating a vibrotactile sensation, which is capable of realizing a tactile sensation generator having a simple structure.

An embodiment of the inventive concept provides an apparatus for generating a vibrotactile sensation, the apparatus including: a light source configured to generate light; a vibration layer receiving the light to generate a vibration; a vibration detection unit disposed adjacent to the vibration layer to detect a vibration signal of the vibration layer; and a control unit connected to the vibration detection unit to determine the vibration of the vibration layer by using the vibration signal. Here, the vibration layer includes: a thermo-elastic layer that has a first thermal expansion coefficient; and a photo-thermal conversion layer that is disposed on the thermo-elastic layer and has a second thermal expansion coefficient less than the first thermal expansion coefficient.

In an embodiment, the thermo-elastic layer may include polyethylene terephthalate (PET).

In an embodiment, the photo-thermal conversion layer may include poly(3,4-ethylenedioxythiophene) (PEDOT).

In an embodiment, the first thermal expansion coefficient may be $100 \times 10^{-6}$ m/K, and the second thermal expansion coefficient may be $50 \times 10^{-6}$ m/K.

In an embodiment, a difference between the thermal expansion coefficients of the thermo-elastic layer and the photo-thermal conversion layer may be $50 \times 10^{-6}$ m/K.

In an embodiment, the light source may include a laser device or a light emitting diode.

In an embodiment, the vibration detection unit may include: a light irradiation part configured to provide detection light to the thermo-elastic layer; and a light receiving part configured to receive the detection light provided to the thermo-elastic layer.

In an embodiment, the detection light may include a continuous-wave laser beam.

In an embodiment, the vibration detection unit may include a piezoelectric sensor.

In an embodiment, the light may include pulse light having a duty cycle.

In an embodiment, the duty cycle may be equal to or less than about 10%.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
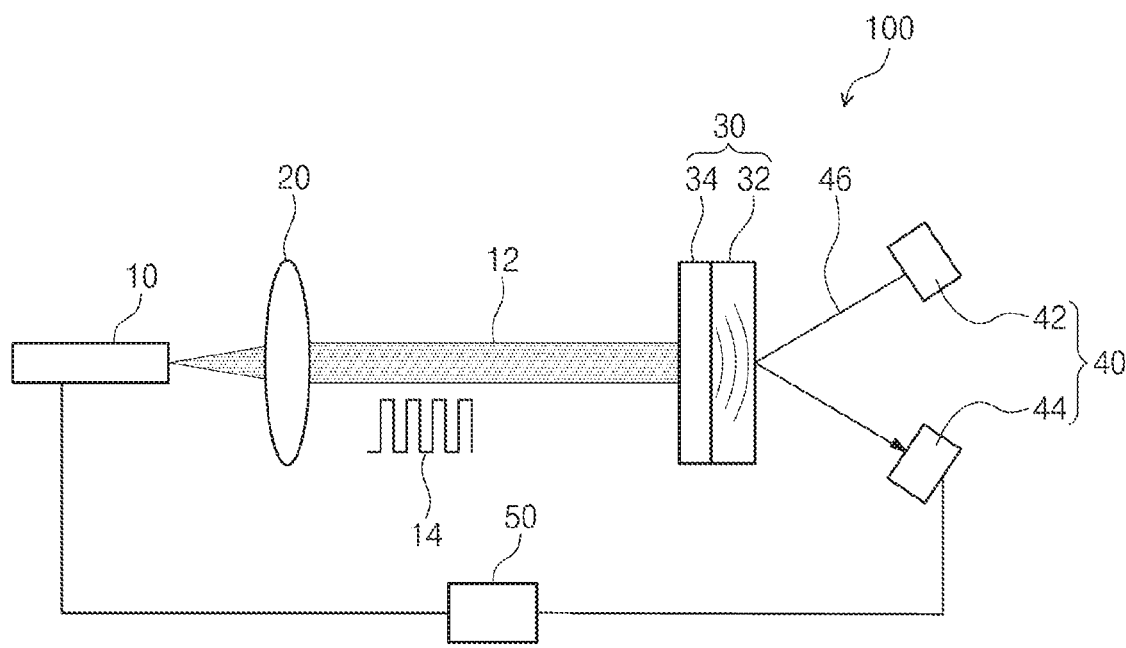
FIG. 1 is a view illustrating an example of an apparatus for generating a vibrotactile sensation according to an embodiment of the inventive concept.

Hereinafter, preferred embodiments of the inventive concept will be described in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

Additionally, the embodiment in the detailed description will be described with sectional views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes.

FIG. 1 is a view illustrating an example of an apparatus 100 for generating a vibrotactile sensation according to an embodiment of the inventive concept.

Referring to FIG. 1, an apparatus 100 for generating a vibrotactile sensation (hereinafter, referred to as a vibrotactile sensation generation apparatus 100) according to an embodiment of the inventive concept may include a light source 10, an optical system 20, a vibration layer 30, a vibration detection unit 40, and a control unit 50.

The light source 10 may include a laser device. The light source 10 may generate first light 12. The first light 12 may have a wavelength of about 532 nm. Alternatively, the light source 10 may include a light emitting diode (LED). The light source 10 may generate visible light having a wavelength in a range from about 400 nm to about 700 nm or infrared light having a wavelength in a range from about 800 nm to about 1800 nm. However, the embodiment of the inventive concept is not limited thereto. For example, the first light 12 may include a pulse laser beam. The first light 12 may have a pulse 14. The pulse 14 may have a pulse frequency of about 1 KHz.

The optical system 20 may be disposed between the light source 10 and the vibration layer 30. The optical system 20 may transmit the first light 12 to the vibration layer 30. The optical system 20 may collimate the first light 12 to the vibration layer 30. For example, the optical system 20 may include a convex lens. Alternatively, the optical system 20 may include a concave lens. However, the embodiment of the inventive concept is not limited thereto.

The vibration layer 30 may be disposed between the optical system 20 and the vibration detection unit 40. The vibration layer 30 may receive the first light 12 to generate a vibration. For example, the vibration layer 30 may include a thermo-elastic layer 32 and a photo-thermal conversion layer 34. The thermo-elastic layer 32 may include polyethylene terephthalate (PET). The photo-thermal conversion layer 34 may be disposed on one side of the thermo-elastic layer 32. The photo-thermal conversion layer 34 may include poly(3,4-ethylenedioxythiophene) (PEDOT). The photo-thermal conversion layer 34 may absorb the first light 12 and convert the first light 12 into thermal energy by using a photo-thermal effect. The thermal energy may be varied periodically according to the pulse 14. The thermo-elastic layer 32 may absorb the thermal energy of the photo-thermal conversion layer to generate a vibration by using a thermo-elastic effect.

According to an embodiment, the thermo-elastic layer 32 and the photo-thermal conversion layer 34 may have a difference between thermal expansion coefficients. When the first light 12 is provided to the photo-thermal conversion layer 34, the thermo-elastic layer 32 and the photo-thermal conversion layer 34 may generate a vibration based on the difference between thermal expansion coefficients. The thermo-elastic layer 32 may have a first thermal expansion coefficient of about $100 \times 10^{-6}$ m/K. The photo-thermal conversion layer 34 may have a second thermal expansion coefficient less than the first thermal expansion coefficient. The second thermal expansion coefficient may be about $50 \times 10^{-6}$ m/K. A difference between the thermal expansion coefficients of the thermo-elastic layer 32 and the photo-thermal conversion layer 34 may be about $50 \times 10^{-6}$ m/K. The first thermal expansion coefficient and the second thermal expansion coefficient may be adjusted to have a difference therebetween. However, the embodiment of the inventive concept is not limited thereto. As the difference between the thermal expansion coefficients of the thermo-elastic layer 32 and the photo-thermal conversion layer 34 increases, an intensity of the vibration may increase.

The vibration detection unit 40 may be disposed at the other side of the thermo-elastic layer 32, which is opposite to the photo-thermal conversion layer 34. The vibration detection unit 40 may be a contactless vibration detection unit. For example, the vibration detection unit 40 may include a light irradiation part 42 and a light receiving part 44. The light irradiation part 42 may provide second light 46 to the other side of the thermo-elastic layer 32. The second light 46 may be vibration detection light. The light receiving part 44 may detect the second light 46 reflected by the thermo-elastic layer 32. For example, the second light 46 may include a continuous-wave laser beam.

The control unit 50 may be connected to the vibration detection unit 40 and the light source 10. The control unit 50 may distinguish the vibration of the vibration layer 30 by using a detection signal of the vibration detection unit 40. Also, the control unit 50 may control the light source 10 to adjust a duty cycle of the pulse 14 and a power of the first light 12.

Figure 2:
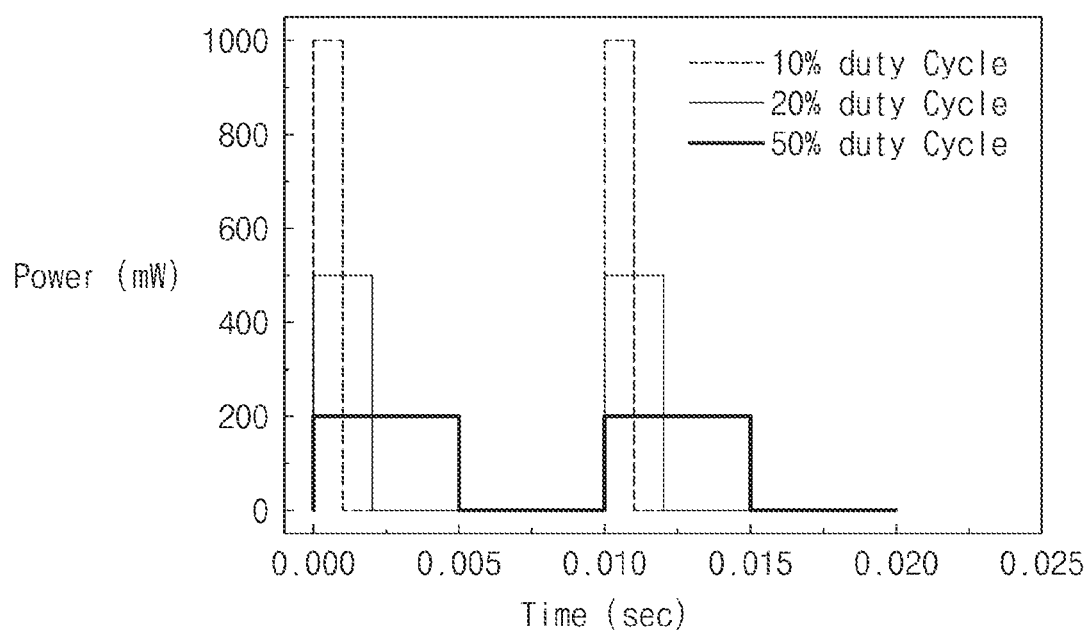
FIG. 2 is a graph showing the duty cycle of a pulse of first light in FIG. 1.

FIG. 2 is a graph showing the duty cycle of the pulse 14 of the first light 12 in FIG. 1.

Referring to FIG. 2, the pulse 14 of the first light 12 may have the duty cycle in a range from about 10% to about 50%.

Figure 3:
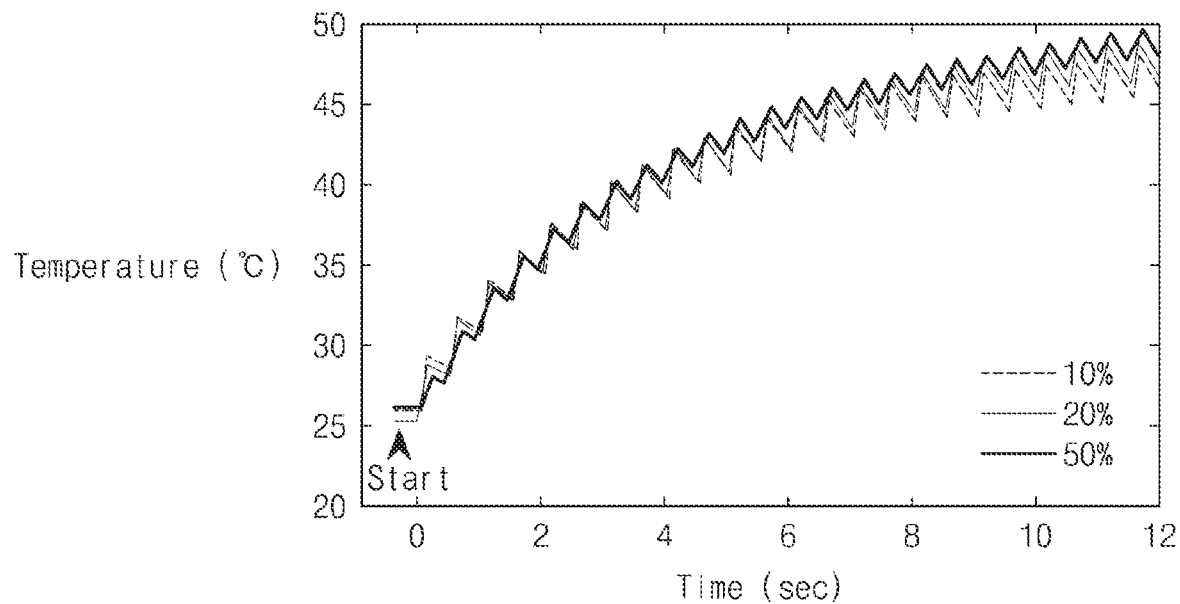
FIG. 3 is a graph showing a temperature variation of a photo-thermal conversion layer according to the duty cycle of the pulse in FIG. 2.

FIG. 3 is a graph showing a temperature variation of the photo-thermal conversion layer 34 according to the duty cycle of the pulse 14 in FIG. 2.

Referring to FIG. 3, the temperature variation of the photo-thermal conversion layer 34 may be inversely proportional to the duty cycle. When the pulse 14 of the first light 12 decreases from about 50% to about 10%, the temperature variation of the photo-thermal conversion layer 34 may increase. The temperature of the photo-thermal conversion layer 34 may gradually increase as a time for providing the first light 12 elapses.

Figure 4:
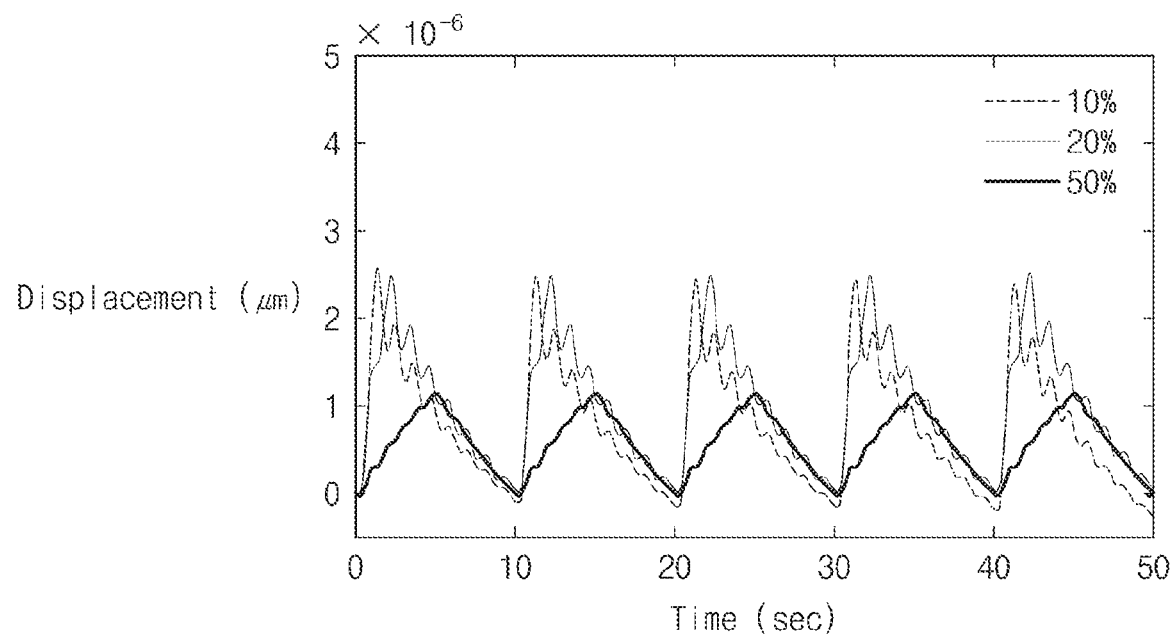
FIG. 4 is a graph showing a displacement of a thermo-elastic layer according to the duty cycle of the pulse in FIG. 2.

FIG. 4 is a graph showing a displacement of the thermo-elastic layer 32 according to the duty cycle of the pulse 14 in FIG. 2.

Referring to FIG. 4, as the duty cycle of the pulse 14 decreases, the displacement of the thermo-elastic layer 32 may increase. That is, the vibration of the thermo-elastic layer 32 may increase. When the duty cycle of the pulse 14 is about 50%, the displacement of the thermo-elastic layer 32 is about 1 μm. When the duty cycle of the pulse 14 is about 20%, the displacement of the thermo-elastic layer 32 is about 2.4 μm. When the duty cycle of the pulse 14 is about 10%, the displacement of the thermo-elastic layer 32 is about 2.5 μm. Thus, the first light 12 of the pulse 14 having the duty cycle less than about 10% may increase the vibration of the thermo-elastic layer 32 and the photo-thermal conversion layer 34.

Figure 5:
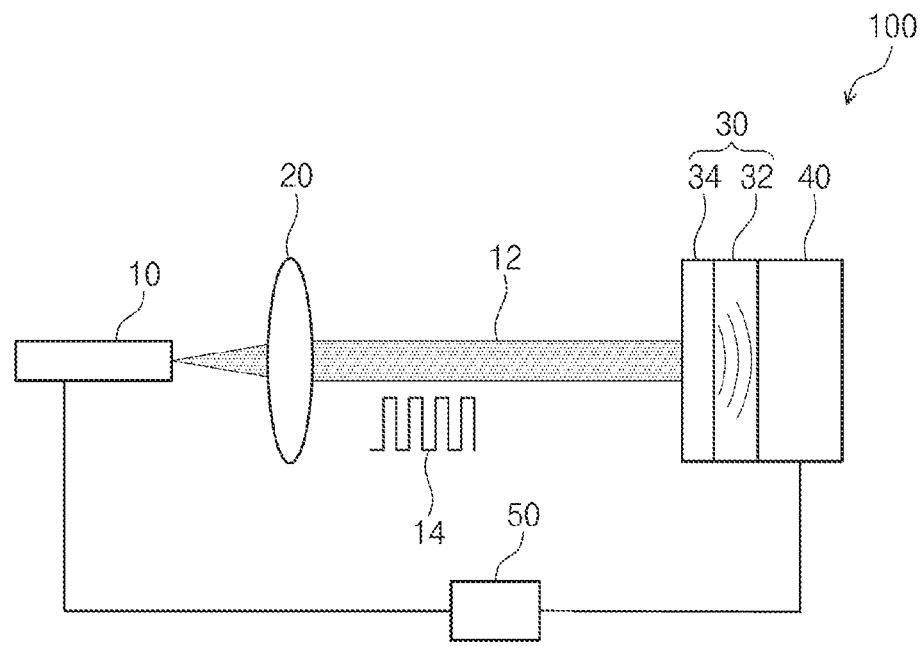
FIG. 5 is a view illustrating an example of the apparatus for generating a vibrotactile sensation according to an embodiment of the inventive concept.

FIG. 5 is a view illustrating an example of the vibrotactile sensation generation apparatus 100 according to an embodiment of the inventive concept.

Referring to FIG. 5, the vibration detection unit 40 of the vibrotactile sensation generation apparatus 100 according to an embodiment of the inventive concept may be a contact vibration detection unit. For example, the vibration detection unit 40 may include a piezoelectric sensor. The light source 10, the optical system 20, the vibration layer 30, and the control unit 50 may be the same as those in FIG. 1.

Figure 6:
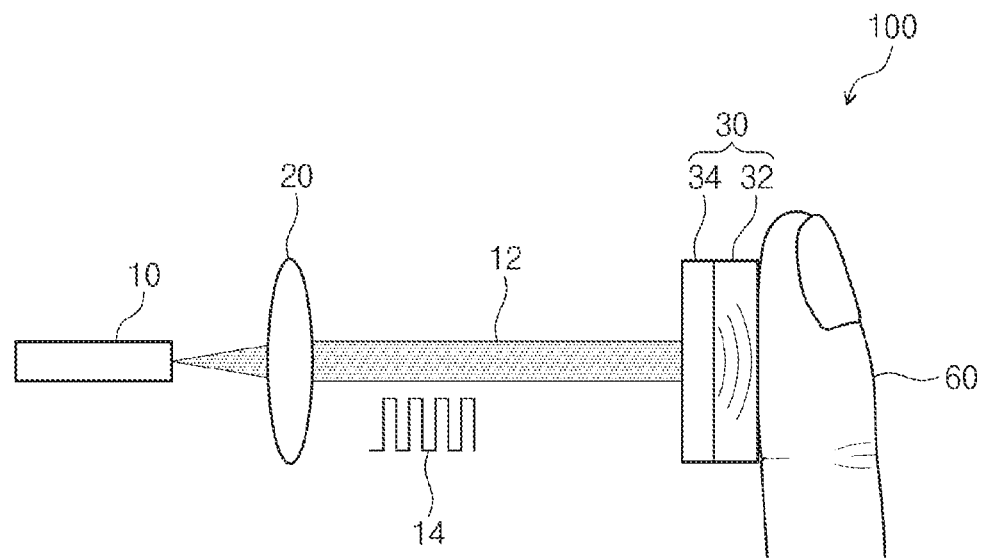
FIG. 6 is a view illustrating an applied example of the apparatus for generating a vibrotactile sensation according to an embodiment of the inventive concept.

FIG. 6 is a view illustrating an applied example of the vibrotactile sensation generation apparatus 100 according to an embodiment of the inventive concept.

Referring to FIG. 6, the vibration layer 30 of the vibrotactile sensation generation apparatus 100 according to an embodiment of the inventive concept may be mounted to a finger 60. When the light source 10 and the optical system 20 provide the first light 12 to the vibration layer 30, the vibration layer 30 may transmit a vibration to a skin of the finger 60 to stimulate the finger 60. That is, the vibration layer 30 may generate a delicate tactile sensation and transmit the generated tactile sensation to the skin of the finger 60. Thus, the vibrotactile sensation generation apparatus 100 according to an embodiment of the inventive concept may realize a tactile sensation generator having a simple structure by using the vibration layer 30 including the thermo-elastic layer 32 and the photo-thermal conversion layer 34 having the difference between the thermal expansion coefficients.

As described above, the apparatus for generating the vibrotactile sensation according to the embodiment of the inventive concept may realize the simple tactile sensation generator by using the vibration layer including the thermo-elastic layer and the photo-thermal conversion layer, which have the difference between the thermal expansion coefficients.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. An apparatus for generating a vibrotactile sensation, comprising:
   a light source configured to generate light;
   a vibration layer receiving the light to generate a vibration;
   a vibration detector disposed adjacent to the vibration layer to obtain a vibration signal of the vibration layer; and
   a controller connected to the vibration detector to determine the vibration of the vibration layer by using the vibration signal,
   wherein the vibration layer comprises:
      a thermo-elastic layer that has a first thermal expansion coefficient; and
      a photo-thermal conversion layer that is disposed on the thermo-elastic layer and has a second thermal expansion coefficient less than the first thermal expansion coefficient.

2. The apparatus of claim 1, wherein the thermo-elastic layer comprises polyethylene terephthalate (PET).

3. The apparatus of claim 2, wherein the photo-thermal conversion layer comprises poly(3,4-ethylenedioxythiophene) (PEDOT).

4. The apparatus of claim 3, wherein the first thermal expansion coefficient is $100 \times 10^{-6}$ m/K, and the second thermal expansion coefficient is $50 \times 10^{-6}$ m/K.

5. The apparatus of claim 4, wherein a difference between the thermal expansion coefficients of the thermo-elastic layer and the photo-thermal conversion layer is $50 \times 10^{-6}$ m/K.

6. The apparatus of claim 1, wherein the light source comprises a laser device or a light emitting diode.

7. The apparatus of claim 1, wherein the vibration detector comprises:
   a light irradiator configured to provide detection light to the thermo-elastic layer; and
   a light detector configured to receive the detection light provided to the thermo-elastic layer.

8. The apparatus of claim 7, wherein the detection light comprises a continuous-wave laser beam.

9. The apparatus of claim 1, wherein the vibration detector comprises a piezoelectric sensor.

10. The apparatus of claim 1, wherein the light comprises pulse light having a duty cycle.

11. The apparatus of claim 10, wherein the duty cycle is equal to or less than about 10%.

* * * * *